United States Patent
Bratkovski et al.

(10) Patent No.: US 8,098,971 B2
(45) Date of Patent: Jan. 17, 2012

(54) METHOD AND APPARATUS FOR ELECTROMAGNETIC RESONANCE USING NEGATIVE INDEX MATERIAL

(75) Inventors: Alexandre Bratkovski, Mountain View, CA (US); Raymond G. Beausoleil, Redmond, WA (US); Shih-Yuan Wang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 121 days.

(21) Appl. No.: 11/230,216

(22) Filed: Sep. 19, 2005

(65) Prior Publication Data

US 2007/0065069 A1    Mar. 22, 2007

(51) Int. Cl.
G02F 1/035    (2006.01)
G02F 1/295    (2006.01)
G02B 6/10    (2006.01)
G02B 6/26    (2006.01)
G02B 6/42    (2006.01)

(52) U.S. Cl. .................. 385/129; 385/2; 385/9; 385/31
(58) Field of Classification Search .................. 385/129, 385/1, 2, 4, 8, 9, 31
See application file for complete search history.

(56) References Cited

U.S. PATENT DOCUMENTS

| | | | |
|---|---|---|---|
| 6,822,784 B2 | 11/2004 | Fukshima et al. | |
| 6,865,009 B2 | 3/2005 | Nishioka | |
| 6,870,517 B1 | 3/2005 | Anderson | |
| 6,931,191 B2 | 8/2005 | Kitagawa et al. | |
| 6,975,664 B1* | 12/2005 | Dodabalapur et al. | 372/102 |
| 7,064,886 B2 | 6/2006 | Moon et al. | |
| 2003/0042487 A1 | 3/2003 | Sarychev et al. | |
| 2003/0063884 A1* | 4/2003 | Smith et al. | 385/129 |
| 2003/0223721 A1 | 12/2003 | Povinelli et al. | |
| 2003/0227415 A1* | 12/2003 | Joannopoulos et al. | 343/754 |
| 2004/0091010 A1* | 5/2004 | Choquette et al. | 372/44 |
| 2004/0135155 A1 | 7/2004 | Otsuka et al. | |
| 2005/0008308 A1 | 1/2005 | Bita et al. | |
| 2005/0047702 A1* | 3/2005 | Parker et al. | 385/1 |
| 2006/0050412 A1 | 3/2006 | Ito et al. | |
| 2006/0171032 A1 | 8/2006 | Nishioka | |

OTHER PUBLICATIONS

Berrier, A., et al., Negative Refraction at Infrared Wavelengths in a Two-Dimensional Photonic Crystal, Physical Review Letters, vol. 93, No. 7, 4 pages, Aug. 13, 2004.

Cowan, B., et al., Photonic Crystal Laser Accelerator Structures, Proceedings of the 2003 Particle Accelerator Conference, pp. 1855-1857, © 2003 IEEE.

(Continued)

*Primary Examiner* — Ryan Lepisto
*Assistant Examiner* — Jerry Blevins

(57) ABSTRACT

An electromagnetic resonance device includes an input reflector, an output reflector, and a periodic dielectric medium (PDM) disposed between the input reflector and the output reflector. The input reflector and output reflector are configured to be reflective to radiation having a wavelength of interest. The PDM includes a periodic structure having a dielectric periodicity between a first surface and a second surface. The dielectric periodicity is configured with a negative refraction for the wavelength of interest. A first radiation is reflected by the input reflector toward the first surface of the PDM, passes through the PDM, and is focused on the output reflector as a second radiation. The second radiation is reflected by the output reflector toward the second surface of the PDM, passes through the PDM, and is focused on the input reflector as the first radiation.

25 Claims, 3 Drawing Sheets

OTHER PUBLICATIONS

Fang, Nicholas, et al., Reports, Sub-Diffraction-Limited Optical Imaging with a Silver Superlens, Science, vol. 308, pp. 534-537, Apr. 22, 2005.

Gersen, H., et al., Direct Observation of Bloch Harmonics and Negative Phase Velocity in Photonic Crystal Waveguides, Physical Review Letters, vol. 94, No. 12, Apr. 1, 2005.

Inoue, K., et al., Photonic Crystals, Physics, Fabrication and Applications, Springer-Verlag Berlin Heidelberg 2004.

Jamois, C., et al., Silicon-based two-dimensional photonic crystal waveguides, Photonics and Nanostructures—Fundamentals and Applications 1, pp. 1-13, 2003.

Joannopoulos, John D., et al., Photonic Crystals, Molding the Flow of Light, Princeton University Press 1995.

Kramper, Patrick, et al., Near-field visualization of light confinement in a photonic crystal microresonator, Optics Letters, vol. 29, No. 2, pp. 174-176, Jan. 15, 2004.

Kramper, P., et al., Highly Directional Emission from Photonic Crystal Waveguides of Subwavelength Width, Physical Review Letters, vol. 92, No. 11, 4 pages, Mar. 19, 2004.

Lagarkov, A.N., et al., Near-Perfect Imaging in a Focusing System Based on a Left-Handed-Material Plate, Physical Review Letters, vol. 92, No. 7, 4 pages, Feb. 20, 2004.

Lee, Y.H., et al., Low Threshold 2-D Photonic Crystal Lasers, TuK2, 0/7803-7500-9/02, pp. 219-220, © 2002 IEEE.

Linden, Stefan, et al., Magnetic Response of Metamaterials at 100 Terahertz, Science, vol. 306, pp. 1351-1353, Nov. 19, 2004.

Liu, Liu, et al., Near-field optical storage system using a solid immersion lens with a left-handed material slab, Optics Express 4836, vol. 12, No. 20, 6 pages, Oct. 4, 2004.

Parazzoli, C.G., et al., Experimental Verification and Simulation of Negative Index of Refraction Using Snell's Law, Physical Review Letters, vol. 90. No. 10., 4 pages, Mar. 14, 2003.

Pendry, J.B., Negative Refraction Makes a Perfect Lens, Physical Review Letters, vol. 85, No. 18, pp. 3966-3969, Oct. 30, 2000.

Pendry, John B., et al., Reversing Light: Negative Refraction, Physics Today, 8 pages, Dec. 2003.

Prasad, Tushar, et al., Superprism phenomenon in three-dimensional macroporous polymer photonic crystals, Physical Review B 67, 7 pages, 2003.

Qiu, Min, et al., Wave Propagation Through a Photonic Crystal in a Negative Phase Refractive-Index Region, IEEE Journal of Selected Topics in Quantum Electronics, vol. 9, No. 1, pp. 106-110, Jan./Feb. 2003.

Ramakrishna, S. Anantha, et al., Removal of absorption and increase in resolution in a near-field lens via optical gain, Physical Review B 67, 4 pages, 2003.

Ripoll, Jorge, et al., Optimal tuning of lasing modes through collective particle resonance, J. Opt. Soc. Am. B, vol. 21, No. 1, pp. 141-149, Jan. 2004.

Schonbrun, Ethan, et al., Negative Refraction in a Si-Polymer Photonic Crystal Membrane, IEEE Photonics Technology Letters, 3 pages, © 2005 IEEE.

Smith, David R., et al., Design and Measurement of Anisotropic Metamaterials that Exhibit Negative Refraction, IEICE Trans. Electron., vol. E87-C, No. 3, pp. 359-370, Mar. 2004.

Smith, David R., et al., Partial focusing of radiation by a slab of indefinite media, Applied Physics Letters, vol. 84. No. 13, pp. 2244-2246, Mar. 29, 2004.

Smith, D.R., et al., Metamaterials and Negative Refractive Index, Science, vol. 305, pp. 788-792, Aug. 6, 2004.

Srituravanich, Werayut, et al., Plasmonic Nanolithography, Nano Letters, vol. 4, No. 6, pp. 1085-1088, 2004.

Srituravanich, W., et al., Sub-100 nm lithography using ultrashort wavelength of surface plasmons, J. Vac. Sci. Technol. B 22(6), pp. 3475-3478, Nov./Dec. 2004.

Wang, X., et al., Unrestricted superlensing in a triangular two-dimensional photonic crystal, Optics Express 2919, vol. 12, No. 13, 6 pages, Jun. 28, 2004.

Yokouchi N et al—Two-Dinenslonal Photonic Crystal Confined Vertical-Cavity Surface-Emitting Lasers-IEEE Journal of Selected Topics in Quantum Electronics vol. 9 No. 5 Sep. 2003.

Zhang X-"Active Lens Realized by Two-Dimensional Photonic Crystal"—Physics Letters A vol. 337 No. 4-6 Apr. 11, 2005—pp. 457-462.

Notomi, M., "Theory of light propagation in strongly modulated photonic crystals: Refractionlike behavior in the vicinity of the photonic band gap," Physical Review B, vol. 62, 10696-705 (2000).

Hewlett-Packard Development Company, L.P., Office Action issued by Chinese State Intellectual Property Office, Application No. 2006800344900 Dated Feb. 12, 2010.

* cited by examiner

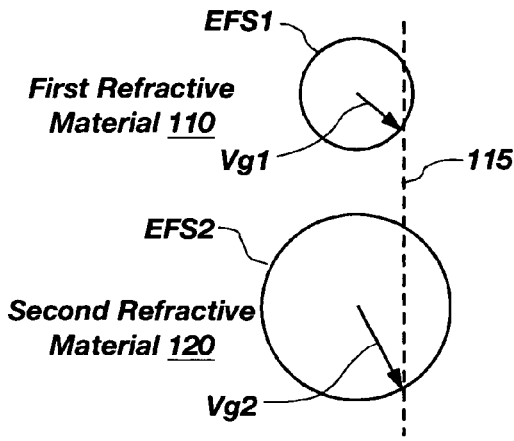
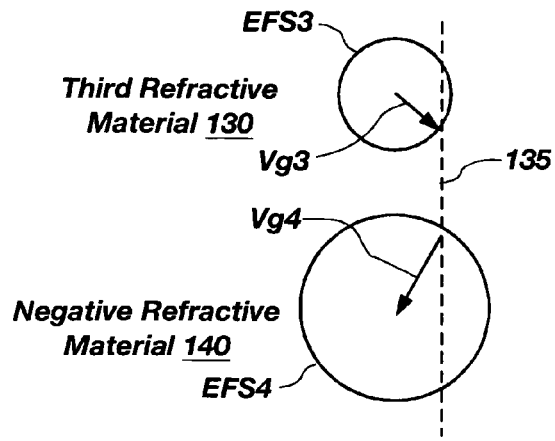
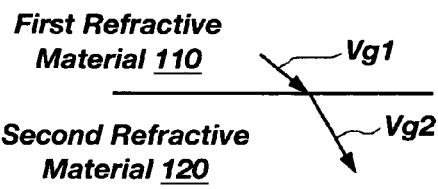
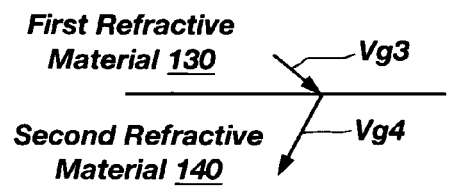
FIG. 1A
FIG. 1B
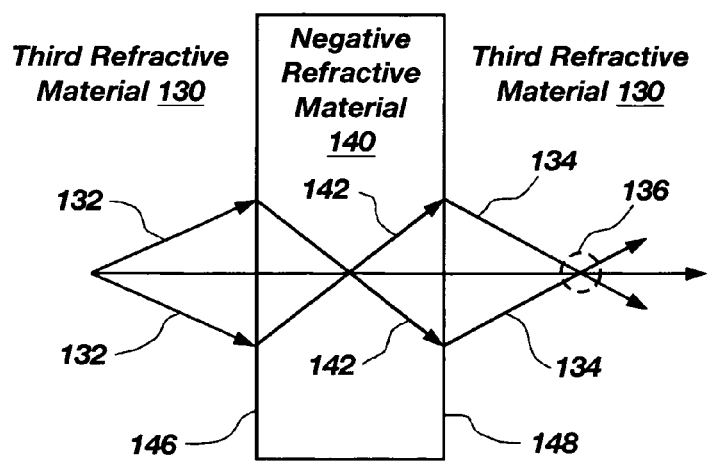
FIG. 2

METHOD AND APPARATUS FOR ELECTROMAGNETIC RESONANCE USING NEGATIVE INDEX MATERIAL

FIELD OF THE INVENTION

The present invention relates generally to modifying an electromagnetic radiation beam and more particularly to devices with a negative refractive index and structures for generating electromagnetic resonance using negative refraction.

BACKGROUND OF THE INVENTION

Photonic crystals are a class of man-made materials, which are often referred to as "meta-materials." Photonic crystals are formed by dispersing a material of one dielectric constant periodically within a matrix having a different dielectric constant. A one-dimensional photonic crystal is a three-dimensional structure that exhibits periodicity in dielectric constant in only one dimension. Bragg mirrors are an example of a one-dimensional photonic crystal. The alternating thin layers have different dielectric constants and refractive indices. The combination of several thin layers forms a three-dimensional structure that exhibits periodicity in dielectric constant in only the direction orthogonal to the planes of the thin layers. No periodicity is exhibited in either of the two dimensions contained within the plane of the layers.

A two-dimensional (2D) photonic crystal can be formed by periodically dispersing rods or columns of a material of one dielectric constant within a matrix having a different dielectric constant. 2D photonic crystals exhibit periodicity in two dimensions (i.e., the directions perpendicular to the length of the rods or columns) but no periodicity is exhibited in the direction parallel to the length of the columns.

Finally, a three-dimensional photonic crystal can be formed by periodically dispersing small spheres or other spatially confined areas of a first material having a first dielectric constant within a matrix of a second material having a second, different, dielectric constant. Three-dimensional photonic crystals exhibit periodicity in dielectric constant in all three dimensions within the crystal.

Photonic crystals may exhibit a photonic bandgap over a range of frequencies in directions exhibiting periodicity in dielectric constant. In other words, there may be a range of frequencies of electromagnetic radiation that will not be transmitted through the photonic crystal in the directions exhibiting dielectric periodicity. This range of frequencies that are not transmitted is known as a photonic bandgap of the photonic crystal.

For an introduction to photonic crystals and their uses and applications, the reader is referred to John D. Joannopoulos, Robert D. Meade & Joshua N. Winn, *Photonic Crystals—Molding the Flow of Light,* (Princeton University Press 1995) and K. Inoue & K. Ithaca, *Photonic Crystals—Physics, Fabrication and Applications,* (Springer 2004)

In natural materials, electromagnetic radiation is refracted at a specific angle and in a specific direction when it encounters a junction between two materials. A class of meta-materials has been studied that refract electromagnetic radiation in the opposite direction from the direction of natural materials. These materials exhibiting negative refraction are often called super-lenses for their ability to refract in a negative direction and, as a result, refocus the electromagnetic radiation, rather than causing the electromagnetic radiation to disperse. Recently, it has been shown that photonic crystals may exhibit this negative refractive index. Many new and useful applications may be possible for these super-lens structures, particularly photonic crystals exhibiting negative refraction.

BRIEF SUMMARY OF THE INVENTION

The present invention, in a number of embodiments, includes methods of developing resonance in an electromagnetic radiation beam and photonic crystals exhibiting negative super-lens properties, wherein the negative refraction properties of the photonic crystals may be used to create resonant structures.

An embodiment of the present invention includes an electromagnetic resonance device comprising an input reflector, an output reflector, and a periodic dielectric medium disposed between the input reflector and the output reflector. The input reflector is configured to be substantially reflective to a first radiation having a wavelength of interest. The output reflector is disposed in a plane substantially parallel to the input reflector and is configured be substantially reflective to a second radiation having the wavelength of interest. The periodic dielectric medium is disposed between the: input reflector and the output reflector and includes a first surface and a second surface, which are each in a plane substantially parallel to the input reflector. In addition, the periodic dielectric medium includes a periodic structure having a dielectric periodicity between the first surface and the second surface. The periodic structure is configured with a negative refraction for electromagnetic radiation at the wavelength of interest. The negative refraction of the periodic dielectric medium focuses the first radiation impinging on the first surface as the second radiation at a second focal location. Similarly, the negative refraction of the periodic dielectric medium focuses the second radiation impinging on the second surface as the first radiation at a first focal location.

Another embodiment of the present invention comprises a method of intensifying an electromagnetic radiation beam. The method includes providing a periodic dielectric medium comprising a negative refractive index at a wavelength of interest. The method further includes reflecting a first radiation toward a first surface of the periodic dielectric medium and reflecting a second radiation toward a second surface of the periodic dielectric medium. The method further includes focusing the second radiation at a second focal location by the first radiation passing through the periodic dielectric medium from the first surface to the second surface. Similarly, the method further includes focusing the first radiation at a first focal location by the second radiation passing through the periodic dielectric medium from the second surface to the first surface.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 1A is a wave-vector diagram illustrating directions of wave propagation at an interface between two isotropic materials;

FIG. 1B is a wave-vector diagram illustrating directions of wave propagation at an interface between an isotropic material and a material exhibiting a negative refractive index;

FIG. 2 illustrates focusing properties of electromagnetic radiation traveling through materials exhibiting a negative refractive index;

DETAILED DESCRIPTION OF THE INVENTION

Figure 3A:
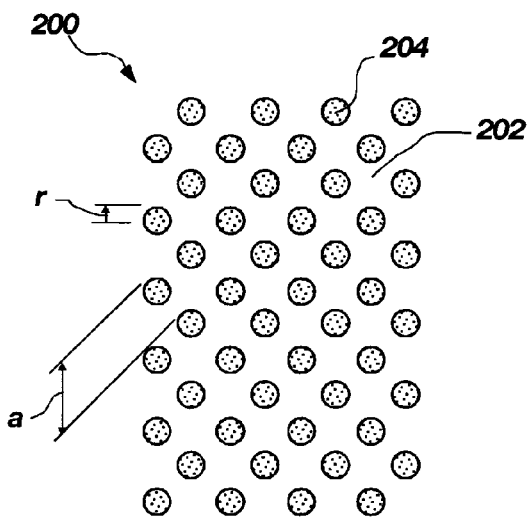
FIG. 3A illustrates a top view of a representative periodic dielectric medium comprising a 2D photonic crystal configured with a triangular lattice.

In the following description, micron-scale dimensions refer roughly to dimensions that range from one micrometer up to a few micrometers, sub-micron scale dimensions refer roughly to dimensions that range from 1 micrometer down to 0.05 micrometers, and nanometer scale dimensions refer roughly to dimensions that range from 1 nanometer up to 50 nanometers (0.05 micrometers).

The present invention, in a number of embodiments, includes electromagnetic radiation resonant structures and methods of developing resonance in an electromagnetic radiation beam. Embodiments of the present invention are configured for providing a periodic dielectric medium that includes a negative refractive index for radiation having a selected wavelength range. For radiation directed at a resonant structure (including the periodic dielectric medium) negative refraction of the radiation as it passes through the periodic dielectric medium (PDM) may generate a focused radiation and a resonance within the resonant structure.

With regard to refraction, Snell's law is a well-known law that models refraction characteristics of a radiation beam as the radiation beam encounters an interface between two mediums with different refractive properties. Basically, Snell's law states that the product of the refractive index and the sine of the angle of incidence of a radiation beam in one medium is equal to the product of the refractive index and the sine of the angle of refraction in a successive medium.

Generally, naturally occurring materials exhibit a positive refractive index. In other words, a radiation beam with an oblique incident angle to a facet of a medium with a high positive refractive index may be deviated toward the surface normal of the facet, and a radiation beam entering a medium of lower refractive index may be deviated away from the surface normal, but the deviation occurs at a positive angle relative to the surface normal. Recently, a number of man-made materials (often referred to as meta-materials) have been developed that exhibit a negative refractive index. With a negative refractive index, the material still obeys Snell's law, but the radiation beam is deviated in the opposite direction from natural materials (i.e., with a negative angle relative to the surface normal). Thus, using Snell's law, the product of the refractive index and the sine of the angle of incidence of a radiation beam in one medium is equal to the negative of the product of the refractive index and the sine of the angle of refraction in a successive medium.

The refractive properties of a positive refractive index and a negative refractive index may be understood using FIGS. 1A, 1B, and 2. FIG. 1A is a wave-vector diagram illustrating directions of wave propagation through two refractive materials (110 and 120) and at the interface between the two refractive materials (110 and 120). Similarly, FIG. 1B is a wave-vector diagram illustrating directions of wave propagation at an interface between a third refractive material 130 and a negative refractive material 140.

FIG. 1A illustrates positive refraction. In FIG. 1A the upper circle illustrates an equal frequency surface EFS1 plot of a first refractive material 110. The lower circle illustrates an equal frequency surface EFS2 plot of a second refractive material 120. EFS2 is a different diameter than EFS1 due, in part, to the difference in dielectric properties between the first refractive material 110 and the second refractive material 120. Group velocity vector Vg1 is oriented perpendicular to, and away from the center of, EFS1 and illustrates the direction of wave propagation through the first refractive material 110. A first frequency line 115 illustrates a specific frequency at which group velocity vector Vg1 intersects EFS1. The first frequency line 115 is carried down to intersect with EFS2. Thus, a group velocity vector Vg2, oriented perpendicular to and away from the center of EFS2, defines the direction of wave propagation through the second refractive material 120 at the same frequency as the wave propagating through the first refractive material 110. The lower portion of FIG. 1A illustrates the two group velocity vectors Vg1 and Vg2 and the direction change that occurs at the boundary between the first refractive medium 110 and the second refractive medium 120. The direction change is due to the difference in the refractive index of the two refractive materials (110 and 120). The positive refraction can be seen by the positive angle from the surface normal for group velocity vector Vg2.

FIG. 1B illustrates negative refraction. In FIG. 1B the upper circle illustrates an equal frequency surface EFS3 plot of a third refractive material 130. The lower circle illustrates an equal frequency surface EFS4 plot of a negative refractive material 140. EFS4 is a different diameter than EFS3 due, in part, to the difference in dielectric properties between the first refractive material 110 and the negative refractive material 140. In addition, in negative refractive index material 140, as the frequency increases the equal frequency surface EFS4 moves inward around the symmetry point. Therefore, the group velocity vector Vg4 points inward indicating negative refraction. As a result, group velocity vector Vg4, illustrating the direction of wave propagation through the negative refractive material 140, is oriented perpendicular to, but toward from the center of, EFS4.

On the other hand, the third refractive material 130 is a positive refractive material similar to the first refractive material 110 and the second refractive material 120. Therefore, group velocity vector Vg3 is oriented perpendicular to and away from the center of EFS3, and illustrates the direction of wave propagation through the third refractive material 130. A second frequency line 135 illustrates a specific frequency at which group velocity vector Vg3 intersects EFS3. The second frequency line 135 is carried down to intersect with EFS4. Thus, group velocity vector Vg4 defines the direction of wave propagation through the negative refractive material 140 of a wave at the same frequency as the wave propagating through the third refractive material 130. The lower portion of FIG. 1B illustrates the two group velocity vectors Vg3 and Vg4 and the direction change that occurs at the boundary between the third refractive medium 130 and the negative refractive medium 140. The negative refraction can be seen by the negative angle from the surface normal for group velocity vector Vg4.

FIG. 2 illustrates focusing properties of electromagnetic radiation traveling through a material exhibiting a negative refractive index. In FIG. 2, a top view illustrates a slab of negative refractive material 140, with third refractive material 130 on opposite sides of the negative refractive material 140. Incident electromagnetic radiation beams have first directions 132 when they impinge on an incident surface 146 of the negative refractive material 140. The negative refractive property of negative refractive material 140 cause the electromagnetic radiation beams to deviate towards second directions 142 with a negative angle from the surface normal of the incident surface 146. As the electromagnetic radiation beams emit from an emitting surface 148 of the negative refractive material 140, they deviate towards third directions 134. As the electromagnetic radiation beams travel in the third direction 134, they converge at a focal point 136.

Photonic crystals have been shown to posses this negative refractive property for certain proportions of the geometry of the photonic crystal relative to the wavelength of electromagnetic radiation that will experience the negative refraction. Some embodiments of photonic crystals are shown in FIGS. 3A, 3B, and 4.

Figure 4:
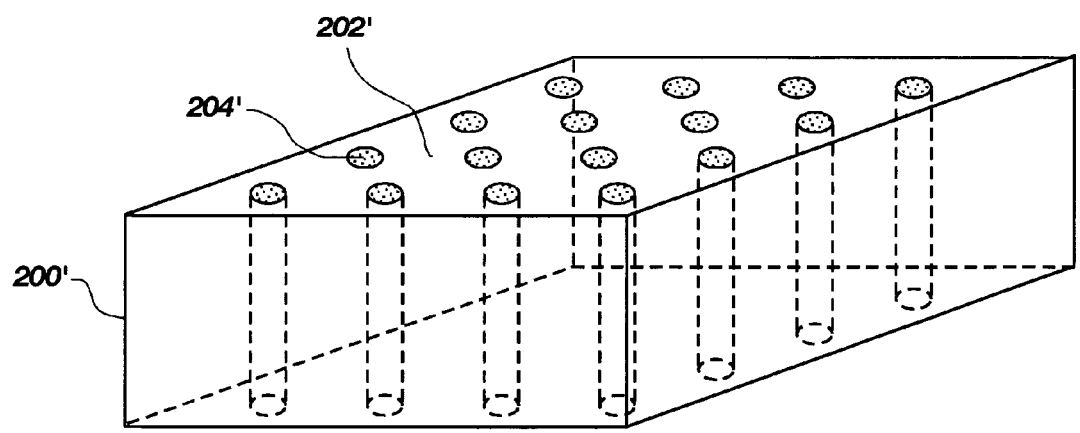
FIG. 4 is a three-dimensional view of a representative 2D photonic crystal configured with a square lattice.

FIG. 3A illustrates a top view of a periodic dielectric medium 200 comprising a 2D photonic crystal 200 configured with a triangular lattice (also referred to as a hexagonal lattice). The 2D photonic crystal 200 comprises a matrix 202 (also referred to as a first material 202). Within the matrix 202, periodically spaced columns 204 (also referred to as cylindrical regions, rods, or a second material) are disposed in an array of horizontal rows and vertical rows. As illustrated in FIG. 3A, these horizontal rows and vertical rows of rods 204 may be disposed to form a triangular lattice wherein each alternate horizontal row and vertical row is displace about half way between the adjacent horizontal row and vertical row.

Figure 3B:
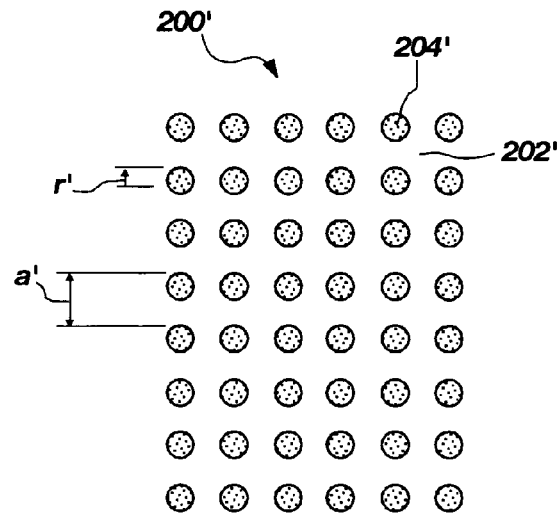
FIG. 3B illustrates a top view of a representative periodic dielectric medium comprising a 2D photonic crystal configured with a square lattice.

FIG. 3B illustrates a top view of a periodic dielectric medium 200' comprising a 2D photonic crystal 200' configured with a square lattice, wherein the periodically spaced columns 204' in adjacent horizontal rows and vertical rows are orthogonally aligned within the matrix 202'. FIG. 4 shows a three-dimensional view of the 2D photonic crystal 200' of FIG. 3A to illustrate the lengthwise dispersion of the rods 204' through the matrix 202'.

In a 2D photonic crystal 200, the matrix 202 comprises a first material 202 with a first dielectric constant and the rods 204 comprise a second material 204 with a second dielectric constant. Thus, dielectric periodicity is exhibited in the photonic crystal in directions perpendicular to the longitudinal axis of the rods 204. If the difference in dielectric constant between the first material 202 and the second material 204 is large enough, a photonic bandgap (i.e., a forbidden frequency range) may occur. This photonic bandgap may create a variety of interesting properties for the photonic crystal. One of those properties is negative refraction.

By way of example and not limitation, a 2D photonic crystal 200 may comprise a matrix 202 of silicon with rods 204 of air, or a matrix 202 of air with rods 204 of silicon. In these embodiments, silicon has a dielectric constant of about 12 and air has a dielectric constant of about one. Other materials, such as, for example, InP, GaAs, and GaInAsP, have been shown to posses a photonic bandgap in combinations with each other and with air. Materials may be chosen to optimize a variety of parameters such as wavelengths where the photonic bandgap occurs, ease of manufacturing, negative refractive properties, or combinations thereof.

Referring to FIGS. 3A and 3B, the photonic crystals have a lattice constant (a, a'), which indicates the lateral spacing between the centers of adjacent rods 204, and the rods 204 have a substantially uniform radius (r, r'). For many purposes, it is useful to discuss a relative radius (i.e. RR=r/a) or discuss the radius (r) as a ratio of the lattice constant (a). By way of example and not limitation, a 2D photonic crystal 200 may be characterized with a lattice constant (a) and a radius proportional to the lattice constant (such as r=0.4a and r=0.35a).

Determining the photonic band structure of a particular photonic crystal is a complex problem that involves solving Maxwell's equations and considering the periodic variation in the dielectric constant through the photonic crystal. Thus, the photonic band structure is at least partially a function of the dielectric constant of the matrix 202, the dielectric constant of the rods 204, the radius (r) of the rods 204, and the lattice constant (a). Computational methods for computing the band structure of a particular photonic crystal are known in the art. An explanation of these computational methods may be found in John D. Giannopoulos, Robert D. Meade & Joshua N. Winn, Photonic Crystals—Molding the Flow of Light, (Princeton University Press 1995), in particular at Appendix D.

Simulations have shown that the negative refractive property of a photonic crystal will be present for a range of wavelengths (λ) within a photonic bandgap of the photonic crystal. By way of example and not limitation, Qui et al. have presented simulations of a 2D photonic crystal 200 comprising InP—InGaAsP indicating a refractive index of about −0.73 with a ratio of lattice constant (a) to frequency (i.e., a/λ) of about 0.325 (IEEE Journal of Selected Topics in Quantum Electronics, Vol. 9, No. 1, January/February 2003, pp. 106-110). In other words, using this illustrative simulation, an infrared radiation beam with a wavelength of about 1230 nm may exhibit a refractive index of about −0.73 when passing through the 2D photonic crystal 200 with a lattice constant (a) of about 400 nm.

Figure 5:
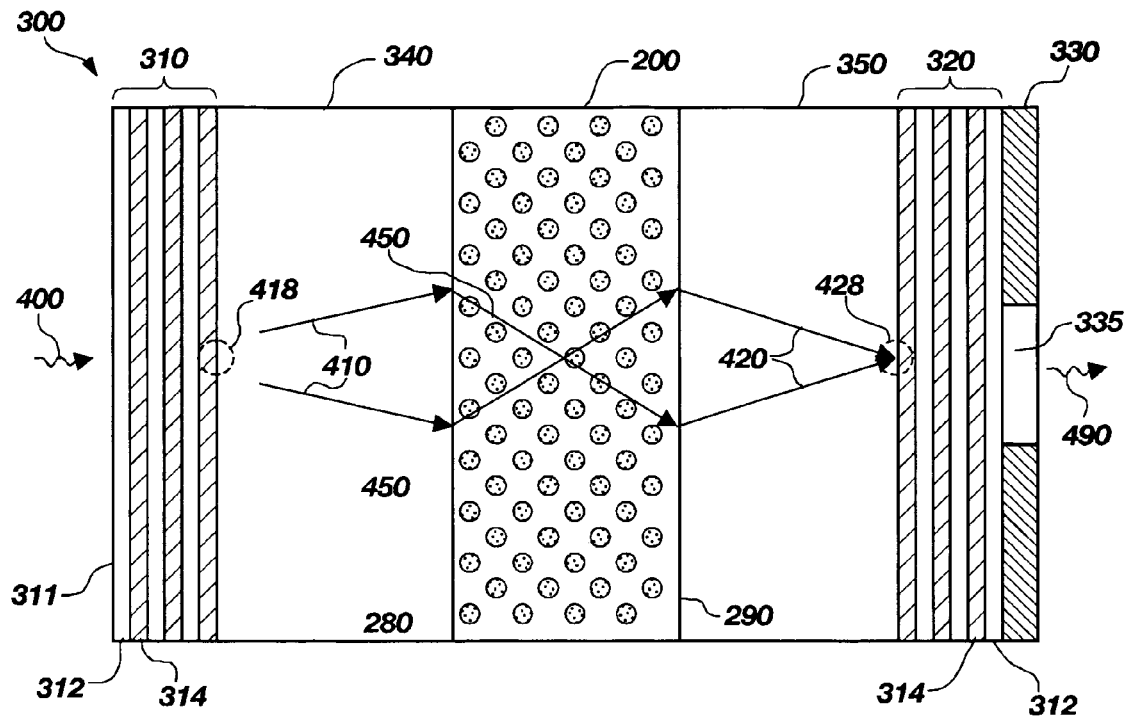
FIG. 5 is a top view of a representative electromagnetic radiation resonant structure including a 2D photonic crystal illustrating a negative refraction that focuses electromagnetic radiation.
Figure 6:
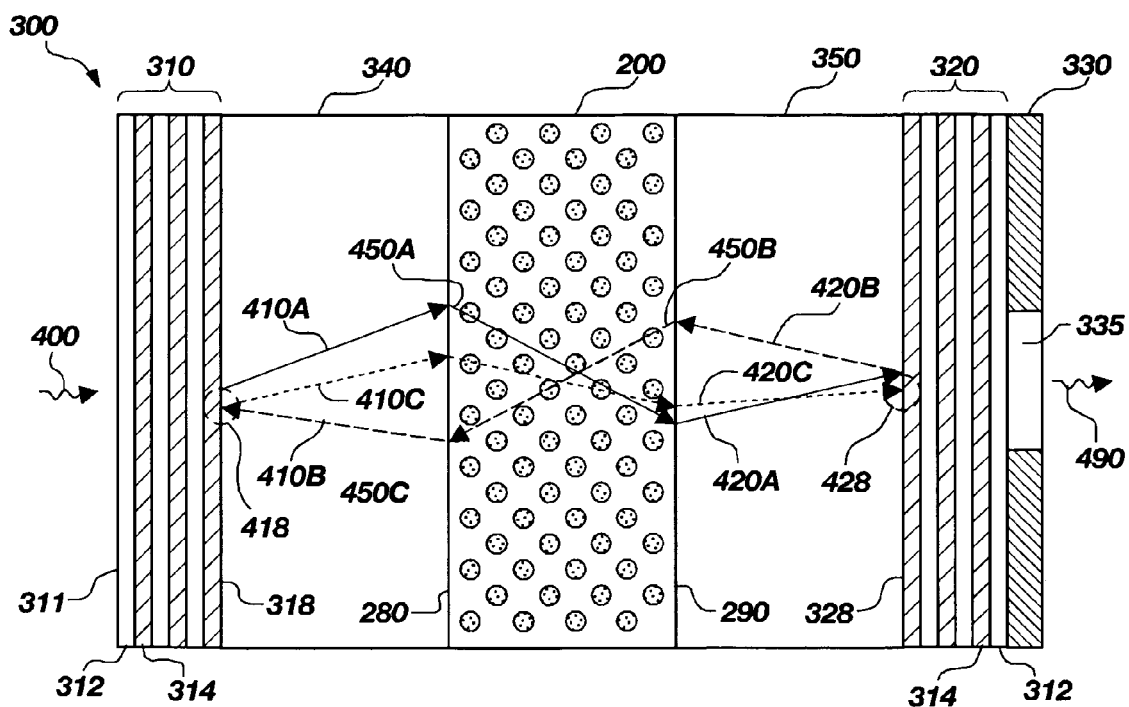
FIG. 6 is a top view of a representative electromagnetic radiation resonant structure including a 2D photonic crystal illustrating a negative refraction and resonance.

FIGS. 5 and 6 are top view illustrations of a representative electromagnetic resonance device 300 including a 2D photonic crystal 200 configured with a triangular lattice. The 2D photonic crystal 200 is positioned between an input reflector 310 and an output reflector 320.

The input reflector 310 and the output reflector 320 may be configured as Bragg reflectors. Bragg reflectors (also referred to as Bragg Mirrors) may be formed in a number of ways using a variety of materials configured as alternating layers having a low and a high refractive index. Each layer may be configured with a thickness of about a quarter wavelength of the wavelength of interest to be amplified by the electromagnetic resonance device 300. The resulting Bragg reflector may also be referred to as a quarter-wave stack. As an example, a Bragg reflector may be formed from alternating layers of GaAs (gallium arsenide) and AlGaAs (aluminum gallium arsenide). Another suitable material combination for forming Bragg reflectors is alternating layers formed respectively from silicon and silicon dioxide. Implementing a larger number of alternating pairs in a Bragg reflector results in a higher refractive index.

By way of example and not limitation, the input Bragg reflector 310 and the output Bragg reflector 320 may be formed from alternating first layers 312 and second layers 314. About twenty to twenty-five layers may result in a reflectivity of about 99.9%, whereas about thirty layers may create a reflectivity as high as 99.99%.

An opaque or highly reflective aperture layer 330 may optionally be formed on the output Bragg reflector 320 to create an aperture 335 configured with a desired size and shape for an emitting radiation 490, which may be emitted through the output reflector 320.

The input reflector 310 is separated from the periodic dielectric medium 200 by a first intermediate medium 340. Similarly, the output reflector 320 is separated from the periodic dielectric medium 200 by a second intermediate medium 350. The intermediate media (340, 350) may be the same material or may be different materials, depending on the desired refractive properties. By way of example and not limitation, the intermediate media (340, 350) may comprise air, silicon, or any other suitable material for transmission of the wavelength of interest.

The electromagnetic resonance device 300 is optically pumped by a pump radiation 400 substantially at the wavelength of interest and directed at an input surface 311 of the input reflector 310. A small portion of the pump radiation 400 may be transmitted through the input reflector 310 and enter the first intermediate medium 340 as a first radiation 410.

FIG. 5 illustrates the focal properties of the periodic dielectric medium 200 due to negative refraction. The first radiation 410 travels through the first intermediate medium 340 and impinges on a first surface 280 of the periodic dielectric medium 200. The 2D photonic crystal 200 causes the first radiation 410 to deflect at a negative refraction angle at the interface between the first intermediate medium 340 and the 2D photonic crystal 200. The radiation passes through the 2D photonic crystal 200 as refracted radiation 450. When the refracted radiation 450 encounters the interface between the 2D photonic crystal 200 and the second intermediate medium 350, it is deflected again at a negative refraction angle. The refracted radiation 450 enters the second intermediate medium 350 as a second radiation 420. Overall, the negative refraction properties of the 2D photonic crystal 200 may cause the second radiation 420 to converge at a second focal location 428.

The lines illustrating first radiation 410, refracted radiation 450 and second radiation 420 are used to illustrate the approximate extent and direction of the radiation beams for ideal negative refraction. Those of ordinary skill in the art will recongnize that all possible angles for the first radiation 410 and second radiation 420, along with corresponding refracted radiation 450 are implied by the drawings illustrating radiation beam refraction.

In addition, while not directly illustrated in FIG. 5, it will be readily apparent to those of ordinary skill in the art that the radiation may travel in the opposite direction. In other words, radiation may travel from the output reflector 320 towards the input reflector 310 to focus the radiation at a first focal location 418. This direction of travel is illustrated in FIG. 6.

FIG. 6 illustrates the resonance properties of the electromagnetic resonance device 300 by following a hypothetical electromagnetic radiation beam. The first radiation 410A travels through the first intermediate medium 340 and impinges on a first surface 280 of the periodic dielectric medium 200. The 2D photonic crystal 200 causes the first radiation 410A to deflect at a negative refraction angle at the interface between the first intermediate medium 340 and the 2D photonic crystal 200. The radiation passes through the 2D photonic crystal 200 as refracted radiation 450A. When the refracted radiation 450A encounters the interface between the 2D photonic crystal 200 and the second intermediate medium 350, it is deflected again at a negative refraction angle. The refracted radiation 450A enters the second intermediate medium 350 as a second radiation 420A.

The second radiation 420A is reflected back toward the 2D photonic crystal 200 as second radiation 420B. When second radiation 420B encounters the interface between the second intermediate medium 350 and the 2D photonic crystal 200, it is deflected again at a negative refraction angle to become refracted radiation 450B. When the refracted radiation 450B encounters the interface between the 2D photonic crystal 200 and the first intermediate medium 340, it is deflected again at a negative refraction angle to become first radiation 410B. First radiation 410B is reflected back toward the 2D photonic crystal 200 as first radiation 410C, which follows the same negative refraction process through the 2D photonic crystal to become refracted radiation 450C and second radiation 420C.

This resonance process of reflecting and focusing may continue indefinitely creating a high Q factor. The high Q factor may occur not only from the reflections, but also from the focusing and refocusing at the first focal location 418 and the second focal location 428.

In addition, the Q factor may be increased by positioning the output mirror such that a second interior surface 328 of the output mirror is substantially near the second focal location 428. Similarly, the Q factor may be increased by positioning the input mirror such that a first interior surface 318 of the input mirror is substantially near the first focal location 418.

The output reflector 320 is not completely reflective. As a result, some of the radiation may be transmitted through the output reflector 320 as emitting radiation 490.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. An electromagnetic resonance device, comprising:
an input reflector substantially reflective to a first radiation having a wavelength of interest;
an output reflector in a plane substantially parallel to the input reflector and not completely reflective to a second radiation having the wavelength of interest;
a reflective aperture layer disposed on the output reflector and including an aperture; and
a periodic dielectric medium disposed between the input reflector and the output reflector, the periodic dielectric medium configured with a negative refraction at the wavelength of interest, wherein radiation having the wavelength of interest enters the resonance device through the input reflector, is reflected back and forth between the input reflector and the output reflector, and after each reflection is focused and refocused by the periodic dielectric medium on the input and output reflectors to intensify the radiation that is output as emitting radiation through the aperture.

2. The device of claim 1, wherein the periodic dielectric medium comprises a 2D photonic crystal comprising a first material including a plurality of periodically spaced columns of a second material.

3. The device of claim 2, wherein the first material comprises a dielectric material and the second material comprises air.

4. The device of claim 2, wherein the first material comprises air and the second material comprises a dielectric material.

5. The device of claim 1, wherein the input reflector comprises a Bragg reflector.

6. The device of claim 1, wherein the output reflector comprises a Bragg reflector.

7. The device of claim 1, wherein the first focal location is located at least substantially near the input reflector.

8. The device of claim 7, wherein the second focal location is located at least substantially near the output reflector.

9. The device of claim 1, wherein at least a portion of a pump radiation at the wavelength of interest is transmitted through the input reflector to enter the electromagnetic radiation device as the first radiation.

10. The device of claim 1, wherein at least a portion of the second radiation is transmitted through the output reflector as the emitting radiation.

11. The device of claim 10, wherein the aperture is configured to define a size and a shape of the emitting radiation.

12. A method of intensifying an electromagnetic radiation beam, comprising:
    providing a periodic dielectric medium comprising a negative refractive index at a wavelength of interest;
    reflecting a first radiation toward a first surface of the periodic dielectric medium;
    reflecting a second radiation toward a second surface of the periodic dielectric medium;
    focusing the second radiation at a second focal location by passing the first radiation through the periodic dielectric medium from the first surface to the second surface;
    focusing the first radiation at a first focal location by passing the second radiation through the periodic dielectric medium from the second surface to the first surface; and
    outputting intensified radiation through an aperture.

13. The method of claim 12, wherein providing the periodic dielectric medium further comprises providing a 2D photonic crystal comprising a first material including a plurality of periodically spaced columns of a second material.

14. The method of claim 12, wherein reflecting the first radiation comprises reflecting the first radiation with an input reflector.

15. The method of claim 14, wherein focusing the first radiation further comprises locating the first focal location at least substantially near the input reflector.

16. The method of claim 14, further comprising:
    directing a pump radiation having the wavelength of interest at an exit surface of the input reflector; and
    transmitting at least a portion of the pump radiation through the input reflector.

17. The method of claim 15, wherein reflecting the second radiation comprises reflecting the first radiation with an output reflector.

18. The method of claim 17, wherein focusing the second radiation further comprises locating the second focal location at least substantially near the output reflector.

19. The method of claim 17, further comprising transmitting at least a portion of the second radiation through the output reflector.

20. The method of claim 12, wherein reflecting the second radiation comprises reflecting the first radiation with an output reflector.

21. The method of claim 20, wherein focusing the second radiation further comprises locating the second focal location substantially near an interior surface of the output reflector.

22. The method of claim 20, further comprising transmitting at least a portion of the second radiation through the output reflector.

23. The method of claim 20, wherein reflecting the first radiation comprises reflecting the first radiation with an input reflector.

24. The method of claim 23, wherein focusing the first radiation further comprises locating the first focal location substantially near an interior surface of the input reflector.

25. The method of claim 23, further comprising:
    directing a pump radiation having the wavelength of interest at an exit surface of the input reflector; and
    transmitting at least a portion of the pump radiation through the input reflector.

* * * * *